United States Patent [19]
Shoji

[11] Patent Number: 5,499,208
[45] Date of Patent: Mar. 12, 1996

[54] INTEGRATED CIRCUIT MEMORY DEVICE

[75] Inventor: Masakazu Shoji, Warren, N.J.

[73] Assignee: AT&T Corp., Murray Hill, N.J.

[21] Appl. No.: 304,311

[22] Filed: Sep. 12, 1994

[51] Int. Cl.$^6$ ............................................. G11C 7/00
[52] U.S. Cl. .................. 365/189.01; 365/100; 365/102; 365/233
[58] Field of Search ............................ 365/94, 100, 102, 365/103, 148, 149, 174, 189.01, 239, 233, 236

[56] References Cited

U.S. PATENT DOCUMENTS 3,812,478  5/1974  Tomisawa et al. ................... 365/100

OTHER PUBLICATIONS

Shoji, M., "Theory of CMOS Digital Circuits and Circuit Failures," Final Manuscript, Princeton University Press, 1992, ISBN 0-691-08703-6, pp. 47–56.

*Primary Examiner*—Joseph A. Popek

[57] ABSTRACT

The present invention comprises a novel memory circuit wherein a plurality of memory cells have passive impedance values representative of the information stored therein. In the circuit, a signal source having a plurality of outputs is operable to provide a sequence of read signals, one signal per output. Each of the plurality of outputs is connected to one of a plurality of memory cells. Each memory cell comprises an impedance element, its impedance value representative of the data value stored therein. All of the memory cells are thereafter connected to a sum line and a read out circuit. When the signal source provides one of the sequence signals to one of the memory cell impedance elements, it affects the signal on the sum line in a manner that is related to the impedance value of the memory cell. By applying each signal in the sequence to a different impedance element, the voltage on the sum line is directly affected by each of the impedance elements in sequence. The read out circuit transforms the read out circuit voltage into a voltage level proportional or otherwise indicative of each impedance value, and thus the stored data, in sequence.

5 Claims, 6 Drawing Sheets

FIG. 4(a) CLOCKIN
FIG. 4(b) $V_1$
FIG. 4(c) $V_2$
FIG. 4(d) $V_3$
FIG. 4(e) $V_4$
FIG. 4(f) $V_5$

FIG. 6(f)  OUTPUT WAVEFORM

OUTPUT WAVEFORM                              TIME

FIG. 10

INTEGRATED CIRCUIT MEMORY DEVICE

FIELD OF THE INVENTION

The present invention relates to the field of integrated circuit memory devices, and in particular, to methods and apparatus for accessing data therefrom.

BACKGROUND OF THE INVENTION

Integrated circuit read only memory (ROM) devices are devices that contain a permanent set of information written into the memory. Under ordinary operation, the content of the memory remains unchanged. Such devices are useful in a variety of applications such as in microprocessor applications where permanent microprocessor instructions are stored within a ROM device.

At present, ROM devices ordinarily comprise an array of memory cells, where each memory cell contains information comprising one digital bit. The ROM array consists of several y-select lines, or columns, and several x-select lines, or rows. Each memory cell is connected between one of the y-select lines and one of the x-select lines, giving each cell a unique x,y address. In order to read the information therein, one of the y-select lines and one of the x-select lines are enabled or switched on, while the remainder remain switched off. When the enable lines are switched off, they are effectively open circuited. In this manner, only one memory cell is connected to an active circuit at a time.

In one prior art ROM circuit, each memory cell comprises a fusible link and a field effect transistor (FET), and is constructed in the following manner. The fusible link directly connects the y-select line to the drain of the FET. The gate of the FET is connected to the x-select line and the source is connected to ground. In order to program information into the ROM, select links are burned out.

The information stored within the ROM is read out in the following manner. A high logic voltage is first provided at the x-select line of the row of the cell to be read, charging the gate of each FET in the row. The y-select line then provides a high logic voltage to the column of the cell to be read, and further connects the column of the cell to be read to the ROM output. If the fusible link has been burned out, and the y-select line is open circuited, then the high logic voltage appears at the connection to the output. If the link has not been burned out, the FET provides a low impedance between the y-select line and ground because of the gate charge provided by the x-select line. As a result, the low impedance produces a low logic voltage at the connection to the output.

One disadvantage of this configuration is that because each cell includes a FET having three terminals, it requires three connections, one to the y-select line, one to the x-select line, and one to ground. Three connections is inefficient for a two dimensional memory.

While several other types of ROMs exist, most access and retrieve data in a similar manner, wherein a particular cell is activated or polled by turning on a select combination of an x-select line and a y-select line. One particular common aspect of existing ROMs is that a combination the x-select, y-select and memory cell FETs are used to connect a single memory cell to the ROM output at a time. Another common aspect is that an active element such as a switch or a FET is ordinarily associated with each memory cell.

It is often only necessary to read out the contents of a ROM in sequence. To do so, a source of read signals sequentially enables the x-select line and y-select line of each memory cell. A row, or x-select line is enabled while each of the y-select lines are enabled sequentially to read each memory cell within the row. When one row has been completely read, the next x-select line is enabled and the y-select lines are again enabled sequentially. The process is repeated for each row in the memory cell.

To turn on the y-select lines in sequence, a sequence of read signals have to be provided to the transistor switches of each y-select line. Each read signal turns on one FET, thereby connecting the y-select line to the ROM output long enough to read the contents of one memory cell. Thereafter, the read signal is removed and the next read signal is provided to the transistor switch of the next y-select line. As a result, the ROM must provide a sequence of read signals to each y-select line and then activate a transistor switch to connect the y-select line to the ROM output in order to read the contents of each cell.

SUMMARY OF THE INVENTION

The present invention includes a novel memory circuit and a novel memory read out method wherein a plurality of memory cells are actively and contemporaneously connected to the memory circuit output. In one embodiment of the circuit, a signal source having a plurality of outputs is operable to provide a sequence of read signals, one signal per output. Each of the plurality of outputs is connected to one of a plurality of memory cells. Each memory cell comprises a passive impedance element, its impedance value representative of the data value stored therein. All of the memory cells are further directly connected to the memory circuit output comprising a sum line and a read out circuit.

When the signal source provides one of the sequence signals to one of the memory cell impedance elements, it affects the signal on the sum line in a manner that is related to the impedance value of the memory cell. By applying each signal in the sequence to a different impedance element, the voltage on the sum line is directly affected by each of the impedance elements in sequence. The read out circuit transforms the read out circuit voltage into a voltage level proportional or otherwise indicative of each impedance value, and thus the stored data, in sequence.

One advantage of the present invention is that it does not require FETs or other means to connect each memory cell to the circuit output in an isolated manner. Other advantages of the present invention result from the use of passive impedance devices as memory cells. First, impedance devices such as capacitors and resistors have two terminals and this require less connections than active elements. Second, capacitors and resistors, for example, may be reproduced in integrated circuits with great accuracy, and their impedance values may represent the data stored within the memory. The use of impedance devices allows for a large useful range of values to be stored in one memory cell, as opposed to a simple digital or binary bit of information.

The above discussed features, as well as additional features and advantages of the present invention, will become more readily apparent by reference to the following detailed description and the accompanying drawings.

BRIEF DESCRIPTION OF THE DRAWINGS

FIGS. 2(a)–2(g) show signal waveforms at various points within the memory circuit device illustrated in FIG. 1 during normal operation;

FIGS. 4(a)–4(f) show the signal waveforms of the various outputs of the ramp step signal source illustrated in FIG. 3 during normal operation;

FIGS. 6(a)–6(f) show signal waveforms at various points within the memory circuit device illustrated in FIG. 5 during normal operation;

FIGS. 9(a)–9(e) show signal waveforms at various points within the rectangular wave pulse generator illustrated in FIG. 8 during normal operation.

DETAILED DESCRIPTION OF THE DRAWINGS

Figure 1:
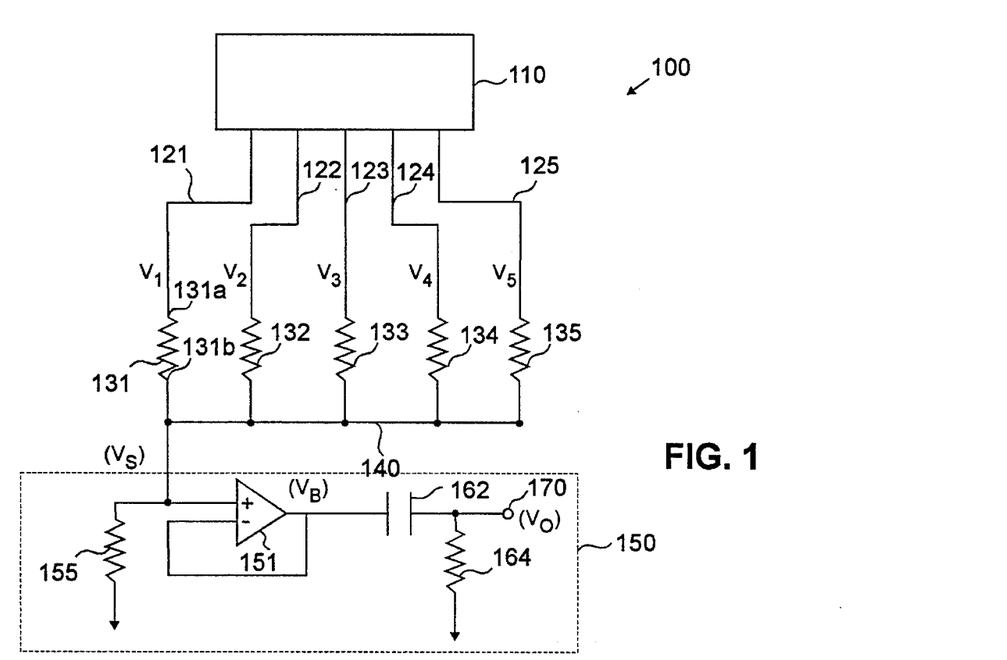
FIG. 1 shows a memory circuit according to the present invention comprising one row of five memory cells wherein each cell comprises a resistor.

FIG. 1 shows a memory circuit 100 that operates according to the present invention. The memory circuit comprises a read signal source 110, a row of five memory cells or resistors 131 through 135 and a readout circuit 150. It will be understood that the memory circuit 100 is given by way of example only, and the use of an example consisting of five memory cells is chosen to illustrate the operation of the invention. The methods and principles of the circuit 100 may readily be extended to a circuit consisting of a substantially greater number of memory cells by those of ordinary skill in the art, and it is well understood that a typical memory device may include many thousands of bits. An example of a larger scale memory device operating in accordance with the principles of the present invention is discussed below in connection with FIG. 10.

The elements of the memory circuit 100 are preferably integrated onto a single semiconductor substrate. The read signal source 110 includes five outputs 121 through 125 and may suitably comprise the circuit described below in connection with FIG. 3. Each of the outputs 121 through 125 is connected to the first terminal of one of the five memory resistors 131 through 135, such that the first output 121 is connected to the first resistor 131, the second output 122 is connected to the second resistor 132, and so forth. Each resistor has two terminals, such as terminals 131a and 131b in the resistor 131. The resistors 131 through 135 may be implemented as any resistors suitable for use in an integrated circuit, such as thin-film deposited resistors or ion-implanted resistors. The resistive values typically range from 100 kΩ to 20 MΩ, the particular resistance value being representative of the information or data value that is to be stored in the cell. For example, a 100 kΩ resistor represents one data value, a 400 kΩ resistor represents another, and so forth.

Each of the second terminals of the memory resistors 131 through 135 are commonly connected to a sum line 140. The sum line 140 is connected to the readout circuit 150 which includes to both a load resistance 155 and a read out circuit comprising a buffer 151 having an input and an output, a capacitor 162 and a resistor 164. The sum line 140 is connected to one input of the buffer 151. The buffer 151 may suitably be a high input impedance unity gain buffer. The load resistance 155 is preferably much larger in resistance value than the memory resistors 131 through 135. In fact, the load resistance 155 may suitably comprise the internal input impedance of the buffer 151.

The output of the buffer 151 is connected through a capacitor 162 to the circuit output 170. A resistor 164 is also connected from the output 170 to ground, thereby forming a differentiator circuit with the capacitor 162. The capacitor 162 and resistor 164 should be chosen such that the time constant of the differentiator circuit, $T_{DIFF}$, is $1/6(\pi)$ to $1/10(\pi)$ where $\pi$ is the ramping period of the ramp step signals produced at outputs 121 through 125.

In operation, the read signal source 110 preferably provides at its five outputs 121 through 125 a sequential series of read signals in the form of ramp step signals. A ramp step signal is a voltage signal that starts at a low voltage level, then increases as a function of time until a step voltage level is reached, at which level it remains thereafter. The ramp step signal sequence appearing across the outputs 121 through 125 is shown in FIGS. 2(a) through 2(e), respectively. The ramping period $\pi$ is the time period during which the signal increases or ramps to the step voltage level. The step voltage level may suitably be 5 volts, and the ramping period may suitably be 10–30 nanoseconds. As shown in FIGS. 2(a)–2(e), during a ramping period, each of the ramp step signals V1 through V5 increases linearly at a rate S, which is equal to the step voltage level divided by the ramping period.

During the ramping period of the first ramp step signal V1, a current flows through the memory resistor 131 to the sum line 140 and continues through the load resistor 155 and the remaining memory resistors 132 through 135. The memory resistor 131 thus creates a voltage divider with respect to the load resistor 155 and the other memory resistors to produce a divided voltage, VS, on the sum line 140. VS is given by the equation $$VS = \frac{R_{131}^{-1}}{R_{131}^{-1} + R_{132}^{-1} + R_{133}^{-1} + R_{134}^{-1} + R_{135}^{-1} + R_{155}^{-1}} V1$$

It is to be noted that, for example, the resistance of the resistor 132 is given by the variable $R_{132}$, and other component values are represented in a like fashion. If a constant K is defined as $$K = \frac{1}{R_{131}^{-1} + R_{132}^{-1} + R_{133}^{-1} + R_{134}^{-1} + R_{135}^{-1} + R_{155}^{-1}}$$

then VS becomes $$VS = \left(\frac{1}{R_{131}}\right) KV1.$$

The voltage V1 during its ramping period may be expressed as the function St. As a result, during the ramping period of V1, the sum line voltage VS comprises a ramp signal that is proportional to the ramp voltage V1 from the output 121. (See FIG. 2).

$$VS = \left(\frac{1}{R_{131}}\right) KSt.$$

The buffer 151, because it provides unity gain in the present embodiment, produces a voltage VB at its output which is substantially equivalent to the voltage VS. The buffer 151 may alternatively provide gain if a higher output level is desired. In any event, the resulting ramp voltage VB is then differentiated by the capacitor 162 and resistor 164, producing a more or less flat voltage level output. The resulting output voltage VO is shown in the first segment 201 of FIG. 2(g). As stated previously, the capacitor 162 and resistor 164 are chosen such that the time constant, $T_{DIFF}$, of the differentiator is $\frac{1}{6}(\pi)$ to $\frac{1}{10}(\pi)$. The flat voltage level VO produced during the ramping period of V1 is $$VO = \left(\frac{1}{R_{131}}\right) KST_{Diff}.$$

Figure 2A:
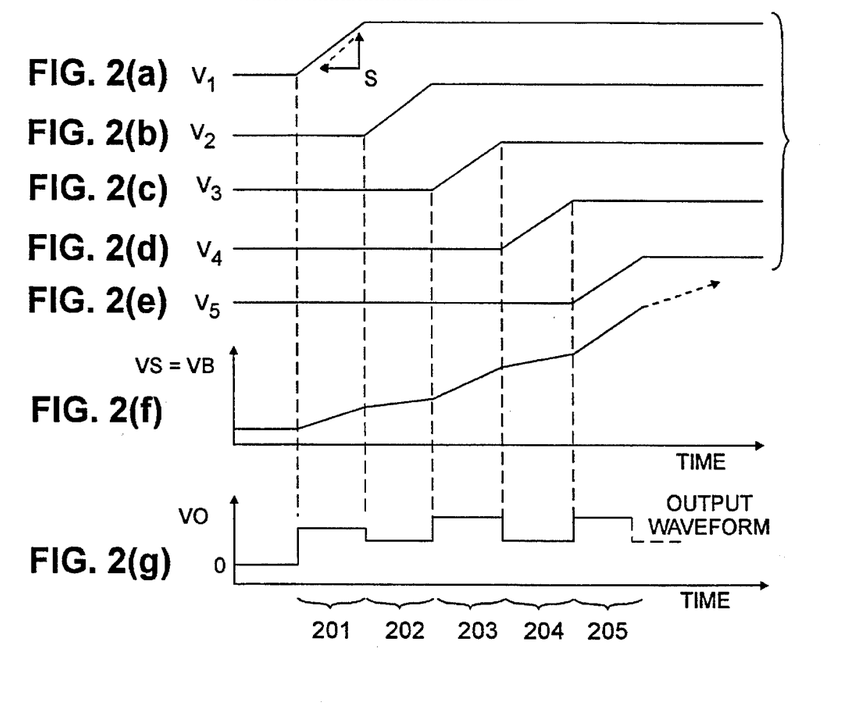

At the time when the voltage V1 reaches the step voltage level, the second output 122 produces the second ramp step signal, beginning with its ramping period signal. The current on the sum line 140 is then equal to the sum of the current due to V1 and the current due to V2. The component of the sum line current due to V1 is constant because of the flat characteristic of V1, as seen in FIG. 2(a), after the step voltage is reached. The component of the sum line current due to V2, however, ramps while V2 is in its ramping period.

As a result, the rate of change of VS is proportional to the rate of change of V2, which should be equivalent to S, or in other words, the rate of change of V1. For the signal V2, $R_{132}$ creates a voltage divider with respect to the load resistor 155 and all of the remaining resistors. As a result, the changing component of VS is given by $$\left(\frac{1}{R_{132}}\right) KSt,$$

where the constant K is the same as described before, when V1 provided the rising voltage.

The buffer 151, as above, then produces a voltage VB that is substantially equivalent to the voltage VS. The resulting voltage VB is then differentiated by the capacitor 162 and resistor 164, producing a more or less flat voltage level output, which is shown as segment corresponding to the time period 202 in FIG. 2(g). The flat voltage level VO is produced during the rising portion of V2 is $$\left(\frac{1}{R_{132}}\right) KST_{Diff}.$$

It is to be noted that because V1 is in a steady state while V2 is ramping, V1 provides no component to the differentiated voltage. Thus, VO, at distinct segments, is proportional to the value of only one of the two memory resistors 131 and 132. (See FIGS. 2 (a), 2(b) and 2(g)).

Thereafter, the remaining outputs 123, 124 and 125 provide, in sequence, ramp step signals of the same shape as V1 and V2. See FIGS. 2(c), 2(d) and 2(e) for diagrams of V3, V4 and V5, respectively. Each of the outputs 123, 124, and 125 provides the output ramp step signal at the time when the voltage from the previous output reaches the step voltage level. In this manner, the current and therefore the voltage VS increases or ramps due to the ramping current flowing into the sum line 140 from only one of the memory resistors 131 through 135 at any one time. As a result, the differentiated signal at VO reflects the contribution of one memory resistor at each segment. The value of each memory resistor may thereby be ascertained, which provides the contents of the memory circuit 100.

FIG. 2(f) shows an exemplary waveform of VS wherein the resistance value of memory resistors 131 through 135 may suitably be 1.66 MΩ, 2.5 MΩ, 1.25 MΩ, 2.5 MΩ, and 1.25 MΩ, respectively. The waveform VS comprises a plurality of segments corresponding to each of the time segments 201 through 205. The voltage on the sum line 140, or more particularly, the change in sum line voltage reveals the memory contents. The read out circuit 150 then transforms the output to a more convenient form. FIG. 2(g) shows VO produced by the read out circuit 150. The memory resistors 131 through 135 produce output voltage levels of 3x, 2x, 4x, 2x and 4x Vdc, respectively, on segments 201 through 205, respectively. The value x is a constant that is dependent upon the value of S and the biasing voltages for the circuit. The memory resistors 131 through 135 may suitably represent the values 3, 2, 4, 2 and 4 stored in the memory. Given the present accuracy of integrated circuit resistor values, data values may readily be scaled to three decimal places of resolution. Thus, for example, each resistor may store a numerical value between 1 and 300. With future improvements in integrated circuit fabrication technology, further resolution would be attainable.

The present invention as incorporated in the above-described example thus provides a novel memory circuit configuration wherein a plurality memory cells comprise passive impedance elements. In contrast, prior art memories employ an active element such as a switch or a transistor in each memory cell to isolate each of the memory cells when it is being read out. Moreover, the present invention is especially suited for memory cells where the data value is represented by a passive impedance value. In the circuit discussed above in connection with FIG. 1, each memory resistor may store a data value having three decimal places of resolution, for example, integers between 1 and 300. Such resolution provides each cell with the equivalent of on the order of 8 bits of binary information.

Figure 3:
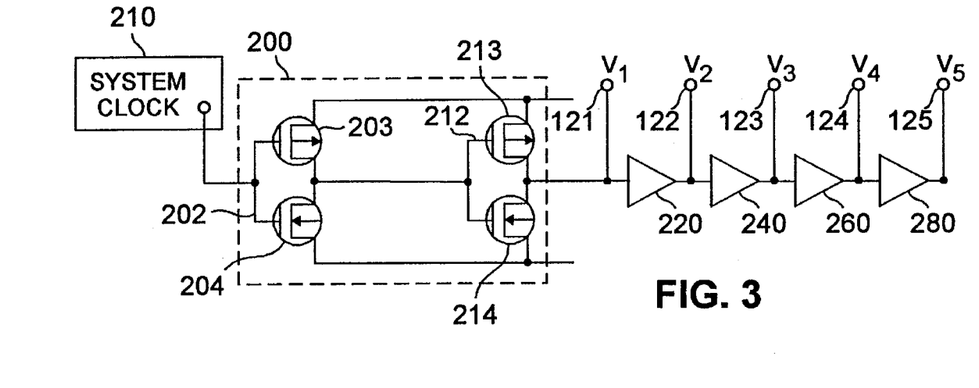
FIG. 3 shows a ramp step signal source which may be employed in the memory circuit device illustrated in FIG. 1.

FIG. 3 illustrates further details of one embodiment of the read signal source 110 including five outputs 121 through 125 for providing a sequence of ramp step signals suitable for use in the circuit 100 illustrated in FIG. 1. The read signal source 110 comprises five delay buffers, 200, 220, 240, 260 and 280, each having an input and an output. The five buffers 200 through 280 are connected in series. The use of the phrase "connected in series" when applied to a group of two or more circuit blocks herein means that the input of each block is connected to the output of the previous block, except for the first of such blocks.

It is to be noted that while the detailed structure of only the buffer 200 is shown and discussed below, the remainder of the buffers 220 through 280 comprise the same structure. The delay buffer 200 comprises an input 202 and an output which serves as the first output 121 of the source 110, and two identically structured inverter circuits connected in series. The first inverter circuit includes a pFET 203 and an nFET 204 connected in a manner well known to produce an inverter, and the second inverter circuit includes a pFET 213 and an nFET 214 connected in a manner well known to produce an inverter. Both inverters are biased by a 5 Vdc bus and a ground bus.

Prior to application of a clock signal, 0 Vdc is present at the input of the first inverter, the inverter formed by FETs 203 and 204. Thus, the output of the first inverter is 5 Vdc. This 5 Vdc output then appears at the input of the second inverter, formed by FETs 213 and 214. The output of the second inverter, which is also the output 121 of the buffer 200, is then 0 Vdc with respect to ground. Likewise, the second buffer 220, having the same structure as buffer 200, also produces an output of 0 Vdc at its output 122. The buffers 220, 240, 260 and 280 similarly produce 0 Vdc at their outputs 123, 124 and 125 respectively.

In operation, a ramp step clock signal is provided by a system clock 210 to the input 202 of the first inverter of the first buffer 200. The ramp step function is chosen such that approximately ½ the step voltage equals the threshold of the first inverter. A suitable system clock operable to provide such signals would be known to those of ordinary skill in the art. At the time the clock ramp signal reaches the first inverter threshold voltage, the first inverter output starts to transition towards the low voltage level, or in other words, its voltage starts to drop towards 0 Vdc. The voltage at the output of the first inverter does not drop instantaneously, however, due to the parasitic capacitance inherent in the physical structure of the FETs 203 and 204. The rate at which the inverter output voltage decreases is referred to as the slew rate.

It is known that the slew rate of an inverter may be controlled by manipulating the geometry of its component FETs. The FETs 202 and 203, and, indeed, the FETs in all the buffers 200 through 280, are fabricated identically in a way such that the slew rate of the inverter causes the transition between 0 Vdc and 5 Vdc, or the reverse, to be equal to the ramping period of the output read signals, V1 through V5. It is known that by increasing the FET's physical length of the FET, its transition time may be increased. For example, in a silicon-based MOSFET, a 1 micron FET transitions from 0 to 5 Vdc in approximately 1 nanosecond while a 3–5 micron FET transitions from 0 to 5 Vdc in 5–10 nanoseconds. Furthermore, a 10 micron FET transitions from 0 to 5 Vdc in 20–30 nanoseconds. The details of the fabrication of these and other types of FETs having the proper slew rates are known to those of ordinary skill in the art.

Figures 4A, 4F:
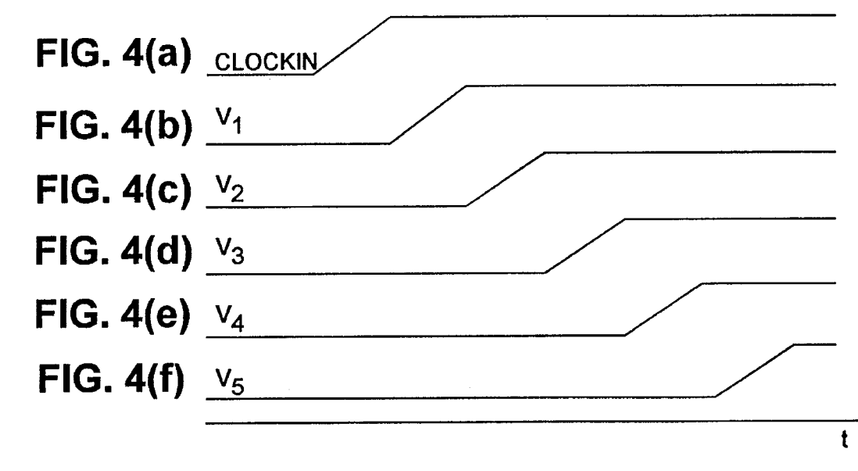

Returning to the description of the circuit's operation, after the first inverter slews downward for approximately ½ the ramping period, the first inverter output reaches the threshold voltage of the second inverter. When the threshold is crossed, the second inverter output 121 will change from 0 Vdc to 5 Vdc, subject again to its slew rate. The second inverter formed by the FETs 213 and 214 produces a signal as shown in FIG. 4(b). To summarize, the delay buffer 200 doubly inverts the clock signal, and the combined slew rates of the first and second inverters provide a delayed ramp step signal, V1, as illustrated in FIGS. 4(a) and 4(b).

The second buffer 220 operates in a similar manner, however, instead of receiving a clock signal at its input, it receives the delayed ramp step signal of the first buffer 200, V1. A doubly inverted and delayed ramp step function as shown in FIG. 4(c) thereafter appears at the output 122 of the second buffer 220. The remaining buffers 240, 260 and 280 operate in like fashion, providing V3, V4 and V5 as shown in FIGS. 4(d), 4(e) and 4 respectively to outputs 123, 124 and 125, respectively.

Figure 5:
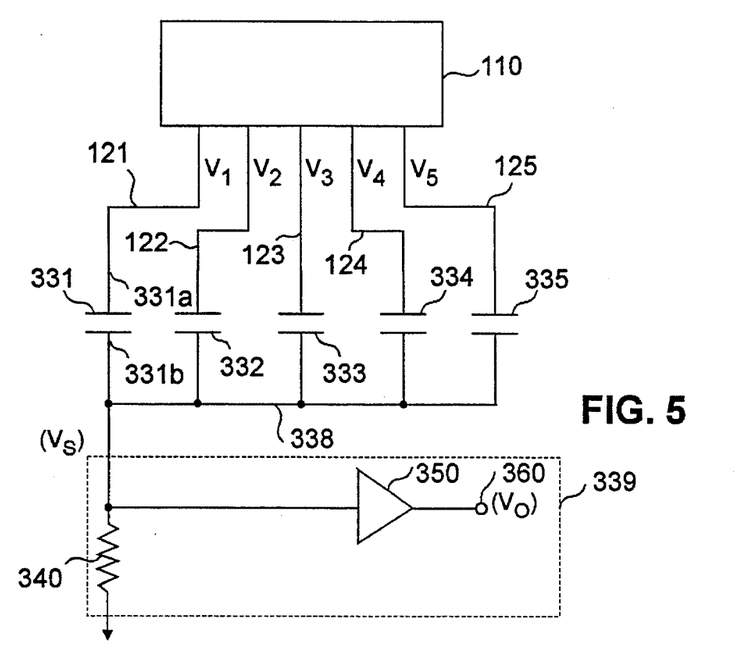
FIG. 5 shows a memory circuit device according to the present invention comprising one row of five memory cells wherein each cell comprises a capacitor.

FIG. 5 shows an alternative embodiment of the memory circuit device according to the present invention wherein the five memory cells comprise five capacitors 331 through 335, and the value of the capacitance represents the information stored within the cells. The circuit in FIG. 5 may suitably employ the same read signal source 110 as discussed above in connection with FIG. 1.

In the embodiment of FIG. 5 the outputs 121 through 125 of the read signal source 110 are each directly connected to a first terminal one of five memory capacitors 331 through 335, such that the first output 121 is connected to the first capacitor 331, the second output 122 is connected to the second capacitor 332, and so forth. Each of the capacitors 331 through 335 have two terminals, such as terminals 331a and 331b of the capacitor 331. The capacitance values typically range from 0.01 pF to 0.1 pF, where the particular value depends upon the information value stored in a cell. For example, a 0.01 pF capacitor represents one data value, a 0.015 pF capacitor signifies another, and so forth.

The second terminal of each memory capacitors 331 through 335 are further connected to a sum line 338. The sum line 338 is coupled to a read out circuit 339 comprising a buffer 350 and a resistor 340. The resistor 340 forms a differentiator circuit with the bank of memory capacitors 331 through 335. The differentiating resistor 340 should be chosen low enough such that the time constant of the circuit, $R_{340} (C_{331}+C_{332}+C_{333}+C_{334}+C_{335})$, is equal to $\frac{1}{6}(\pi)$ to $\frac{1}{10}(\pi)$ where, again, $\pi$ is the ramping period of each of the signals $V_1$ through $V_5$. The buffer 350 may suitably be a high gain buffer. The buffer 350 is further connected to the circuit output 360.

In operation, the read signal source 110 provides at its outputs 121 through 125 a sequence of ramp step signals V1 through V5 in substantially the same manner as discussed above in connection with FIG. 1. FIGS. 6(a) through 6(e) show the signals V1 through V5. When signal V1 begins to ramp, the memory capacitor 331 and the differentiating resistor 340 differentiate the V1 signal.

The differentiated signal may be expressed as $VS=C_{331}R_{340}$ (dV1/dt). During the ramping period, dV1/dt is equal to a constant value S. Therefore, in its first segment, $VS=C_{331}R_{340}S$. The remaining capacitors do not significantly affect the signal on the sum line 338 because of the low value chosen for the time constant $R_{340} (C_{331}+C_{332}+C_{332}+C_{334}+C_{335})$.

When V2 begins to ramp, V1 becomes constant, causing the capacitor 331 to create a passive, steady state circuit between the first output 121 and the rest of the circuit. As a result, the voltage or the sum line 338 will be influenced by only the ramping V2. The sum line voltage equals the voltage V2 differentiated by $R_{340}$ and $C_{332}$. As a result, the second segment of VS will then equal $C_{332}R_{340}S$.

Figures 6A, 6F:
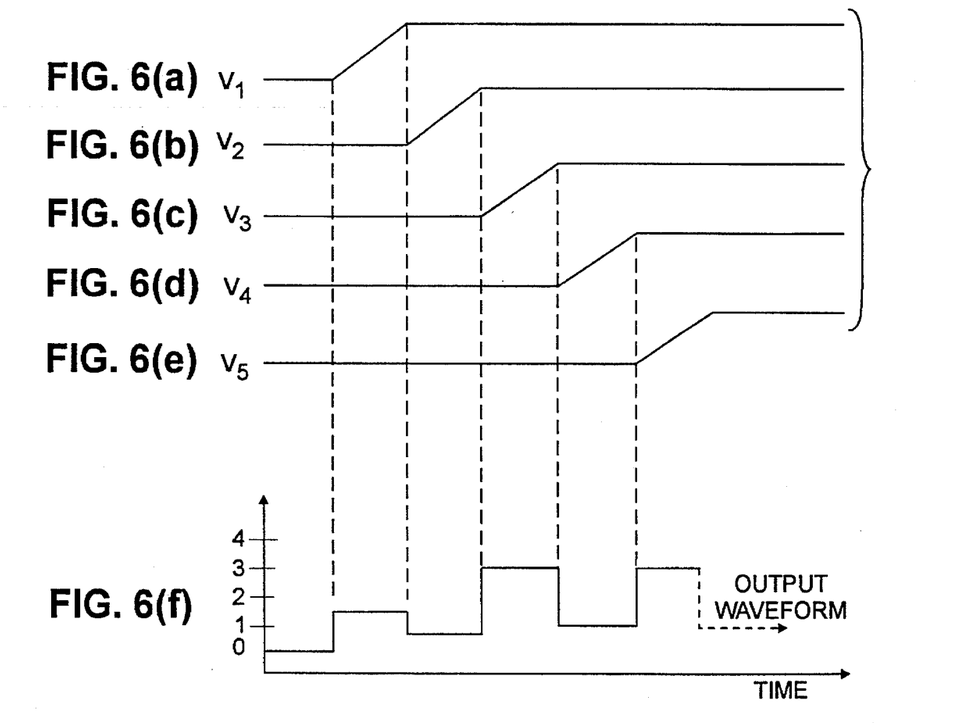

Thereafter as the read signal source 110 provides the ramp step signal to each of the outputs 123 through 125 sequentially, as shown in FIGS. 6(a) to 6(e), the signal VS exhibits a sequence of segments having voltage levels that are proportional to the values of the memory capacitors 331 through 335 as seen in FIG. 6(f). As was the case in the circuit 100 illustrated in FIG. 1, the output levels are indicative of the value stored within the memory cell, although in this case such values are represented by the capacitance values of the memory capacitors 331 through 335. In the present embodiment, the capacitance values may suitably represent a numerical value between 1 and 20, where a 0.01 pF capacitor represents a numerical value of 1 and a 0.1 pF capacitor represents a numerical value of 20, with more or less even intervals of 0.005 pF between adjacent values. Again, future fabrication improvements would allow additional intervals.

In another embodiment of the present invention, the circuit in FIG. 5 is modified to operate with an alternative read signal source 110. Instead of utilizing a read signal source that is operable to provide read signals in the form of ramp step signals, this alternative embodiment employs a read signal source operable to provide rectangular wave pulse signals. A rectangular wave pulse signal consists of a signal that rapidly transitions from a low voltage state to a high voltage state, remains at the high voltage state for a predetermined period, and then rapidly transitions back to the low voltage state. The sequence of rectangular wave signals appearing at the source outputs 121 through 125 is illustrated in FIGS. 7(a) through 7(e).

In the operation of the alternative embodiment of the circuit in FIG. 5, the read signal source 110 provides at its outputs 121 through 125 a sequence of rectangular wave pulses. FIGS. 7(a) through 7(e) illustrate for the signal waveforms appearing across the outputs 121 through 125. For the particular embodiment described herein, the rectangular wave signals may suitably be 5 volts in amplitude and have a duration of approximately 10–100 nanoseconds. All the pulses in the sequence should have substantially identical amplitudes and periods.

When the first output 121 produces the first rectangular wave pulse, the fast rise time of the pulse provokes an impulse response from the capacitor 331, or $C_{331}$. For the impulse response, $C_{331}$ creates a voltage divider with respect to the remaining memory capacitors $C_{332}$ through $C_{335}$, as well as the load resistor. The load resistor 340, however, is chosen to be large enough that it does not effect the impulse response. To choose the proper resistor, the time constant of the circuit formed by $R_{340}$ ($C_{331}+C_{332}+C_{332}+C_{334}+C_{335}$) should be at least 6 to 10 times the period of the rectangular wave pulse.

The resulting output voltage VS on the sum line 338 equals $$VS = \delta \frac{C_{331}}{C_{331} + C_{332} + C_{333} + C_{334} + C_{335}}$$

where $\delta$ is the magnitude of the impulse in V1, which equals 5 volts. If a constant K is defined as:

$$K = \frac{1}{C_{331} + C_{332} + C_{333} + C_{334} + C_{335}}$$

then the output voltage equals $VS=C_{331}K\delta$.

For the remaining duration of the rectangular wave pulse, the voltage VS remains substantially at the impulse voltage due to the long time constant created by the large $R_{340}$.

Figure 7A:
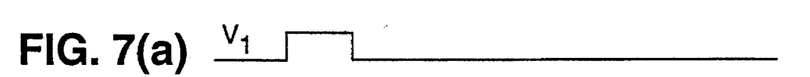
FIGS. 7(a)–7(f) show signal waveforms at various points within an alternative embodiment of the memory circuit device illustrated in FIG. 5 during normal operation.
Figure 7B:
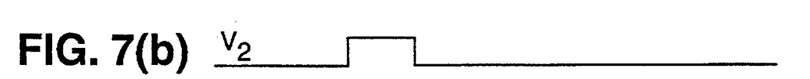
Figure 7C:
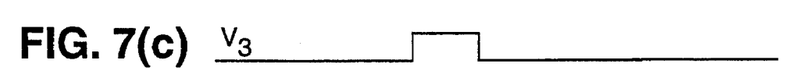
Figure 7D:
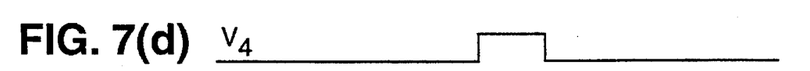
Figure 7E:
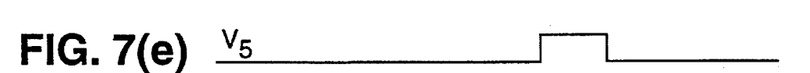
Figure 7F:
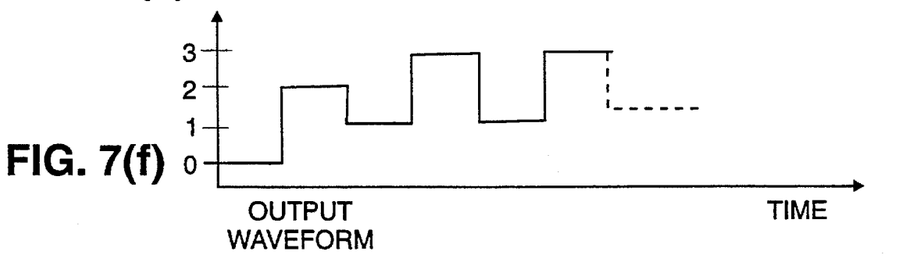

The downward impulse then created at the end of the rectangular wave pulse as shown in FIG. 7(a) causes VS to tend to return to zero volts rapidly. During or after the downward impulse of V1 occurs, output 122 provides an upward impulse that signifies the beginning of another rectangular wave pulse, now in V2. Again, the fast rise time of V2 provokes an impulse response from the capacitor 332. In this case, the capacitor 332 creates a voltage divider with respect to the remaining memory capacitors 331, 333, 334, and 335, and the load resistor 340. The impulse response provides a sum line voltage of $VS=C_{332}k\delta$. As before, the voltage VS will remain substantially at the impulse response voltage due to the large time constant created by $R_{340}$.

Thus, the voltage VS provides a sequence of signal segments at voltage levels that are directly proportional to the capacitance of each of the memory capacitors 331 through 335. The output voltage VO is then isolated from the sum line 338 by the buffer 350. FIG. 7 illustrates an example of the sum line voltage for a circuit where: $C_{531}$=0.02 pF; $C_{532}$=0.01 pF; $C_{533}$= 0.03 pF; $C_{534}$=0.01 pF; and $C_{535}$=0.03 pF. The data stored by such capacitance values is 4, 2, 6, 2 and 6, respectively.

Figure 8:
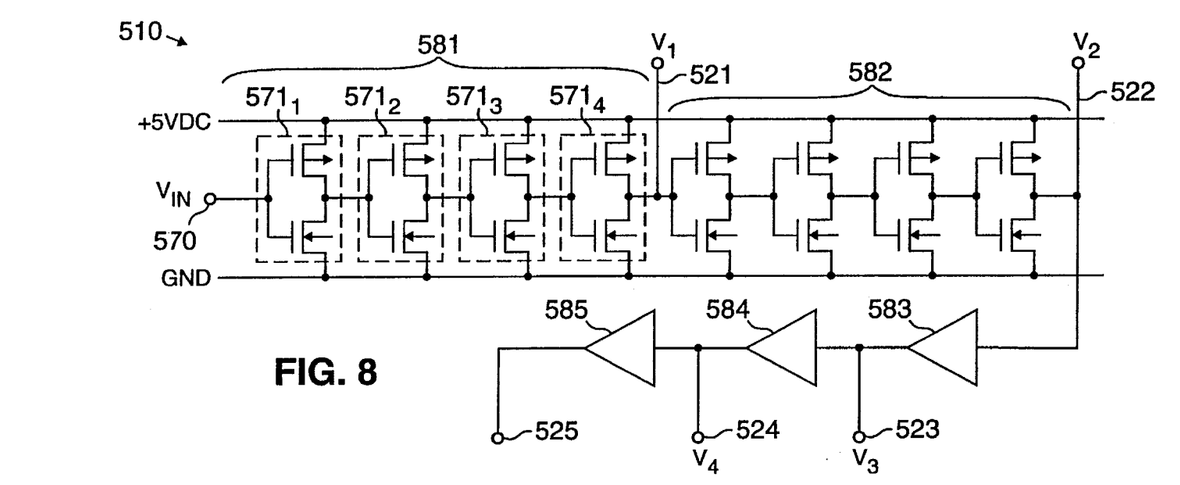
FIG. 8 shows an example of a rectangular wave pulse generator which may be employed in the alternative embodiment of memory circuit device illustrated in FIG. 5.

An example of a suitable rectangular wave pulse source 510 is illustrated in FIG. 8. The square pulse source 510 may be used as the read signal source 110 in the alternative embodiment of the circuit in FIG. 5. The pulse source 510 comprises five propagating pulse buffers 581 through 585. The propagating pulse buffers 581 through 585 each include one of five output connections 521 through 525, respectively, which in turn may each be connected to a distinct memory cell, such as the memory cells 331 through 335 in FIG. 5. Although the propagating pulse buffer 581 is shown and briefly described below, further details regarding the operation of this circuit may be found in M. Shoji, "Theory of CMOS Digital Circuits and Circuit Failures," pp. 483–494 (Princeton Univ. Press 1992), which is incorporated by reference herein.

The propagating pulse buffer 581 consists of an input 570 connected to a first inverter $571_1$. The first inverter $571_1$ is further connected to a second inverter $571_2$, which in turn is connected to a third inverter $571_3$, which in turn is connected to a fourth inverter $571_4$. The output of the fourth inverter $571_4$ is then connected to the first source output connection $521_4$. Each of the inverters $571_1$ through $571_4$ comprises a well-known two FET inverter structure, and each is connected to a +5 Vdc bias voltage and ground. The propagating pulse buffers 582, 583, 584 and 585 comprise similar structures.

Figures 9A, 9E:
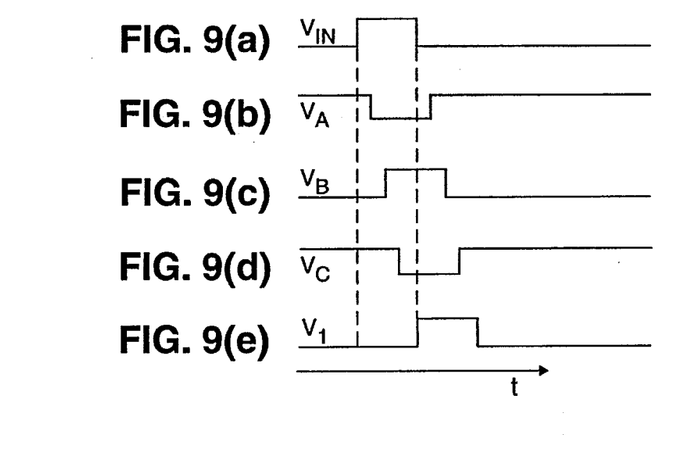

The pulse source 510 operates in the following manner. A rectangular wave pulse clock signal is provided at the input 570. The inverter $571_1$ provides a delayed, inverted rectangular wave pulse signal, $V_A$, at its output as illustrated in FIG. 9(b). The amount of delay is determined by the inherent capacitance of the circuit elements in the inverter. As was the case in the inverters employed in the circuit in FIG. 3, the delay of the inverter may be adjusted by manipulating the length of the constituent FETs.

The inverters $571_1$ through $571_4$ should exhibit a rise time of approximately 1/n the length of the pulse, where n is the number of inverters per propagating pulse buffer. It should be noted that attempts to reduce the number of circuit elements by reducing the number of inverters per buffer may compromise ability of the pulse to propagate through the circuit. In fact, in order to decrease the rise time of the output pulse while maintaining the pulse delay, fast inverters should be used, and the number of inverters per buffer should preferably be increased to 6 or even 10. The improved rise time elicits a better impulse response from the memory circuit capacitors 531 through 535.

Each of the above examples illustrate the method of the present invention applied to one row of five memory cells. Practical applications, however, may require substantially more than five memory cells. To this end, the principles discussed above may readily be applied to large scale memory circuits.

As an initial matter, it should be noted that on the order of forty memory cells, either memory resistors or memory capacitors, may be accommodated by the single row structures in FIGS. 1 and 5. For example, in FIG. 1, there may be forty outputs, similar to the outputs 121 through 125, connected to forty memory resistors. The memory resistors are all connected thereafter to the sum line 140 and the read out circuit.

Figure 10:
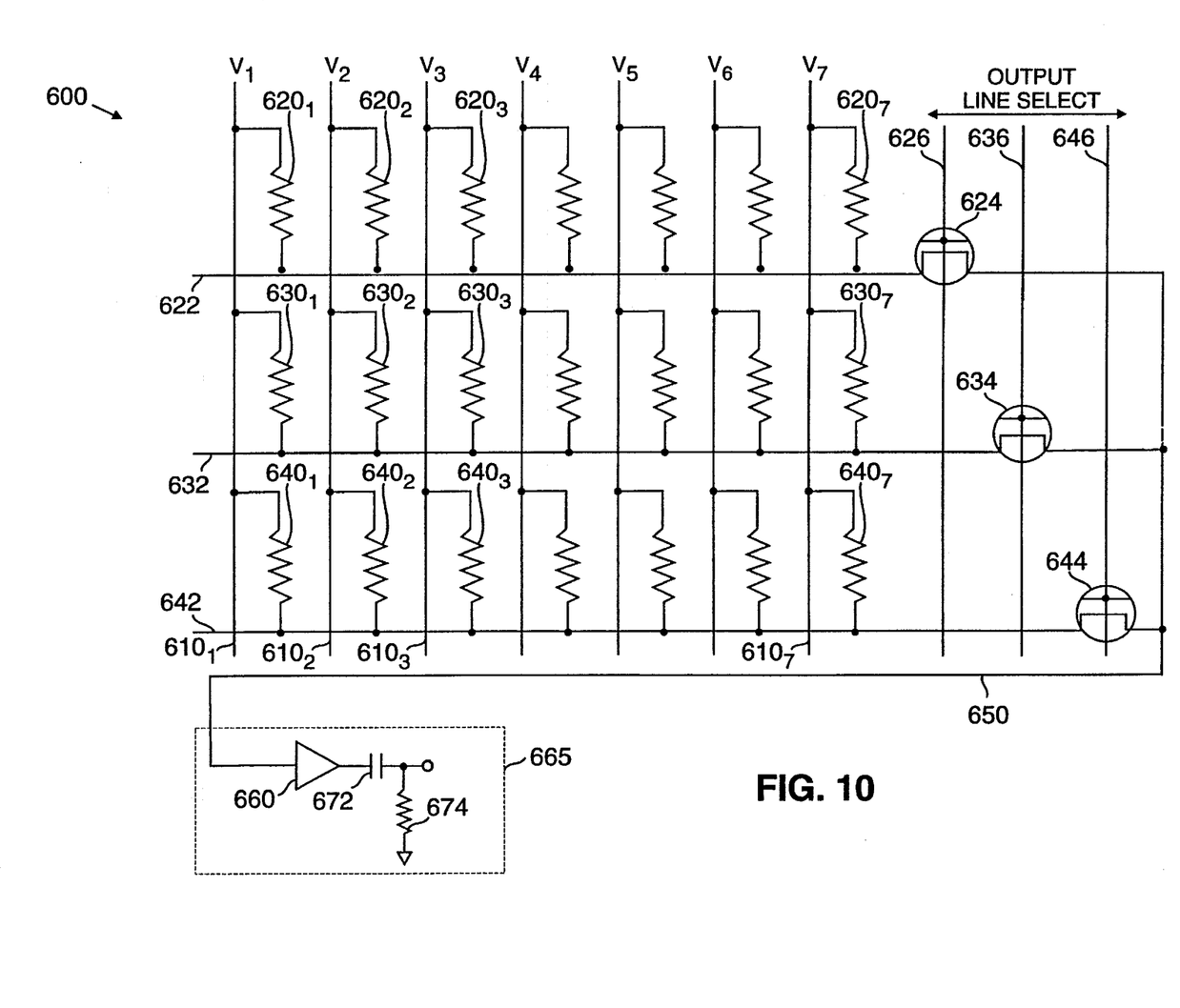
FIG. 10 shows a larger scale memory circuit device according to the present invention.

Furthermore, several of such rows of memory cells may be integrated together, each row associated with its own sum line. The several sum lines may then be selectively enabled, one at a time. An example of such a circuit is illustrated in FIG. 10 and described below. FIG. 10 shows a memory circuit 600 consisting of 3 rows of 7 memory cells. The number of cells is given by way of example, and much larger memory circuits of on the order of 1,000 rows of 40 memory cells or, in other words, 40,000 cells, may be readily implemented by those of ordinary skill in the art. The elements of the circuit in FIG. 10 may all be implemented on a single integrated circuit. Furthermore, a suitable read signal source may also be integrated into the circuit to reduce the external circuitry required.

The memory circuit 600 comprises seven output lines $610_1$ through $610_7$ that form a two dimensional matrix with three sum lines 622, 632 and 642. The seven output lines $610_1$ through $610_7$ are connected to a ramp step signal source, not shown, which may suitably be of the kind described in connection with FIG. 3, above. Each of the output lines $610_1$ through $610_7$ is connected to a distinct resistor of the first row of memory resistors $620_1$ through $620_7$. The memory resistors $620_1$ through $620_7$ are further connected to the sum line 622. Likewise, each of the output lines $610_1$ through $610_7$ is connected to a distinct resistor of the second row of memory resistors $630_1$ through $630_7$, the memory resistor $630_1$ through $630_7$, are further connected to the sum line 632. Finally, each of the output lines $610_1$ through $610_7$ is further connected to a distinct resistor of the third row of memory resistors $640_1$ through $640_7$. The memory resistors are further connected to the sum line 642.

Each of the sum lines 622, 632 and 642 is connected to a distinct read out select switch of three switches 624, 634 and 644. The switches 624, 634, and 644 connect the sum lines 622, 632 and 642, respectively to the read out line 650. The read out line select switches 624, 634 and 644 are further operably connected to one of three select lines 626, 636 and 646, respectively. The read out line 650 is connected to a read out circuit 655 comprising a buffer 660, a capacitor 672 and a resistor 674. The read out line 650 is connected to the input of the buffer 660. The buffer 660 is thereafter connected to a differentiator circuit created by the capacitor 672 and the resistor 674.

The contents of the memory circuit illustrated in FIG. 10 may be sequentially read out in the following manner. In general, the memory resistors $620_1$ through $620_7$, $630_1$ through $630_7$ and $640_1$ through $640_7$ are read row by row, in sequence. To this end, only one of the sum lines 622, 632, and 642 is enabled at one time. When a particular sum line is enabled, the memory resistors connected thereto are read out in a manner similar to that described in connection with the operation of the circuit in FIG. 1.

To read out the first row of memory resistors, an enable signal is provided to the first read out select switch 624 through the select line 626. The enabled select switch 624 allows current to flow from the first sum line 622 to the read out line 650. Once the sum line 622 is connected to the read out line, a sequence of ramp step signals is provided to the outputs $610_1$ through $610_7$ in the same manner as described above in connection with FIG. 1. The read out circuit 655 then provides a multiple segment output signal, each segment corresponding to one of the ramp step signals provided at the outputs $610_1$ through $610_7$ and indicative of the resistance value of the resistors $620_1$ through $620_7$ in a similar manner as the circuit described in connection with FIG. 1, above. When the first row has been read out, the enable signal is removed from the first select switch 624. An enable signal is then provided to the second select switch 634 through the select line 636, and the second row is read out in the same manner as the first. After the second row is read out, the third row is enabled and read out.

It is to be understood that the above-described embodiments of the invention are merely illustrative. Other implementations may readily be devised by those skilled in the art which will embody the principles of the invention and fall within the spirit and scope thereof. For example, while exemplary embodiments are disclosed using resistors and capacitors as memory cells, other passive impedance devices such as a diode may be used. The impedance characteristics of a diode are nonlinear, but nevertheless may be adjusted to correspond to different data values by manipulating doping levels. The resulting nonlinear resistance values may then represent data store within the memory.

I claim:

1. A method of obtaining data values stored within a memory circuit having a plurality of memory cells, each of the plurality of memory cells having a resistance value representative of the data stored therein, each of the memory cells connected to a source of ramp step signals and to a sum line, the method comprising:
    a) generating a first ramp step signal and providing the first ramp step signal to a first memory cell to cause the voltage on the sum line to increase at a rate proportional to the resistance value of the first memory cell;
    b) differentiating the sum line voltage to provide an output voltage proportional to the resistance value of the first memory cell;
    c) generating a subsequent ramp step signal and providing the subsequent ramp step signal to a subsequent memory cell to cause the voltage on the sum line to ramp at a rate proportional to the resistance value of the subsequent memory cell;
    d) differentiating the sum line voltage to provide an output voltage proportional to the resistance value of the subsequent memory cell; and
    e) repeating steps c) and d) for each of the plurality of memory cells.

2. A method of obtaining data values stored within a memory circuit having a plurality of memory cells, each of the plurality of memory cells comprising a capacitance value representative of the data stored therein, each of the memory cells connected to a source of ramp step signals and to a sum line, the method comprising:
    a) generating a first ramp step signal and providing the first ramp step signal to a first memory cell;
    b) effecting differentiation of the first ramp step signal using a differentiating circuit comprising a differentiating resistor and the first memory cell to provide an output voltage proportional to the capacitance value of the first memory cell;
    c) generating a subsequent ramp step signal and providing the subsequent ramp step signal to a subsequent memory cell;
    d) effecting differentiation of the subsequent ramp step signal using a differentiating circuit comprising the differentiating resistor and the subsequent memory cell to provide an output voltage proportional to the capacitance value of the subsequent memory cell; and
    e) repeating steps c) and d) for each of the plurality of memory cells.

3. A method of obtaining data values stored within a memory circuit having a plurality of memory cells, each of the plurality of memory cells having a capacitance value representative of the data stored therein, each of the memory cells connected to a source of rectangular wave pulse signals and to a sum line, the method comprising:
    a) generating a first rectangular wave pulse signal and providing the first rectangular wave pulse signal to a first memory cell to provide a voltage on the sum line proportional to the capacitance value of the first memory cell;

b) generating a subsequent rectangular wave pulse signal and providing the subsequent rectangular wave pulse signal to a subsequent memory cell to provide a voltage on the sum line proportional to the capacitance value of the subsequent memory cell;

c) repeating step b) for each of the plurality of memory cells.

4. A sequential semiconductor memory device, comprising:

a plurality of memory cells, each memory cell providing an impedance value corresponding to a stored data value; and a readout circuit responsive to a single clock signal source for sequentially reading the data values stored in the memory cells, said readout circuit comprising a plurality of delay buffers connected in series, each delay buffer connected to one of the memory cells.

5. A sequential semiconductor memory device, comprising:

a plurality of memory cells, each memory cell providing a capacitance value corresponding to a stored data value; and a readout circuit responsive to a single clock signal source for sequentially reading the data values stored in the memory cells, said readout circuit comprising a plurality of delay buffers connected in series, each delay buffer connected to one of the memory cells.

* * * * *